United States Patent
Belyansky et al.

(10) Patent No.: US 6,914,015 B2
(45) Date of Patent: Jul. 5, 2005

(54) HDP PROCESS FOR HIGH ASPECT RATIO GAP FILLING

(75) Inventors: Michael P. Belyansky, Bethel, CT (US); Patricia Argandona, Poughkeepsie, NY (US); Gregory DiBello, Mahopac, NY (US); Andreas Knorr, Austin, TX (US); Daewon Yang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,857

(22) Filed: Oct. 31, 2003

(65) Prior Publication Data

US 2005/0095872 A1 May 5, 2005

(51) Int. Cl.[7] .............................................. H01L 21/31
(52) U.S. Cl. ....................... 438/788; 438/435; 438/787; 438/424
(58) Field of Search ................................. 438/221, 296, 438/424, 435, 778, 782, 787, 788, 791, 792

(56) References Cited

U.S. PATENT DOCUMENTS

| 5,976,993 A | * | 11/1999 | Ravi et al. ................... 438/788 |
| 6,136,685 A | * | 10/2000 | Narwankar et al. ......... 438/784 |
| 6,194,038 B1 | * | 2/2001 | Rossman ..................... 427/569 |
| 6,211,040 B1 | | 4/2001 | Liu et al. |
| 6,395,150 B1 | | 5/2002 | Van Cleemput et al. |
| 6,500,771 B1 | * | 12/2002 | Vassiliev et al. ............. 438/783 |
| 6,511,922 B2 | * | 1/2003 | Krishnaraj et al. ......... 438/778 |
| 6,514,837 B2 | | 2/2003 | Lee et al. |
| 6,531,377 B2 | | 3/2003 | Knorr et al. |
| 2003/0003244 A1 | | 1/2003 | Rossman |
| 2003/0013270 A1 | | 1/2003 | Seitz |
| 2003/0013271 A1 | | 1/2003 | Knorr et al. |
| 2003/0050724 A1 | | 3/2003 | M'Saad et al. |

OTHER PUBLICATIONS

High–Density Plasma Chemical Vapor Deposition of Silicon–Based Dielectric Films for Integrated Circuits, S.V. Nguyen; IBM Journal of Research and Development, vol. 43, 1/2, 1999, Plasma Processing.

* cited by examiner

Primary Examiner—Kevin M. Picardat
(74) Attorney, Agent, or Firm—Steven Capella; Cantor Colburn LLP

(57) ABSTRACT

An HDP process for high aspect ratio gap filling comprises contacting a semiconductor substrate with an oxide precursor under high density plasma conditions at a first pressure less than about 10 millitorr, wherein said gaps are partially filled with oxide; and further contacting the substrate with an oxide precursor under high density plasma conditions at a second pressure greater than about 10 millitorr, wherein said gaps are further filled with oxide.

23 Claims, 3 Drawing Sheets

Conventional Process (low pressure)

FIG. 5

High Pressure process

FIG. 6

HDP PROCESS FOR HIGH ASPECT RATIO GAP FILLING

BACKGROUND OF INVENTION

The present disclosure generally relates to semiconductor apparatuses and manufacturing processes, and more particularly, relates to processes for high aspect ratio gap fill.

The semiconductor industry in general is being driven to decrease the size of semiconductor devices located on integrated circuits. Miniaturization is needed to accommodate the increasing density of circuits necessary for today's semiconductor products. As memory devices, such as dynamic random access memory (DRAM), are scaled down in size, various aspects of manufacturing DRAM integrated circuits are becoming more challenging. For example, extreme aspect ratios (the ratio of the vertical depth of a trench to the horizontal width) in small-scale devices present etch and deposition process challenges.

Insulating materials, for example, $SiO_2$, are used to isolate conductors and other active regions in semiconductor devices. In prior art back-end-of-line (BEOL) applications, e.g., insulation for metal lines, a plasma enhanced chemical vapor deposition (PECVD) process based on a tetraethoxysilane (TEOS) source precursor was typically used for the deposition of insulating material, which resulted in an isotropic or conformal deposition profile. An anisotropic etch was then used, such as a physical sputter etch, to remove the insulating material overhangs that covered areas that needed to be filled, and another insulating layer was deposited, e.g., by PECVD. A technique used to deposit insulators that is being used more frequently in densely-packed semiconductor devices having small feature sizes and high aspect ratios is high density plasma chemical vapor deposition (HDP-CVD). HDP-CVD has been used in the BEOL in the past, and is also being used in the front-end-of-line (FEOL), for shallow trench isolation (STI). Generally, the HDP-CVD ions and electrons are generated in an inductively coupled radiofrequency (RF) plasma (no electrode in non-capacitively coupled plasmas). An RF biasing power is applied to another (substrate-holding) electrode to create a significant ion bombardment (i.e., sputter etching) component during deposition. For gap filling, HPD-CVD processes provide simultaneous deposition and etching in which loosely deposited films or "deposited species" over planar to topographical surface are sputtered off by reactive ions and radicals during deposition. In this manner, voids can be eliminated during the gap full process. However, HDP-CVD is proving a challenge with today's rapidly increasing high aspect ratio features, which are approaching 4:1 and higher.

Several commercial HPD-CVD systems have been developed in connection with efforts to advance the integrated circuit technology to the ultra-large scale integration (ULSI) level. These systems use either electron cyclotron resonance (ECR) or inductively coupled plasma (ICP) sources for high-density plasma generation. Current HDP-CVD processes generally employ the use of a relatively low pressure (about 2 to about 10 mTorr range) to achieve a high electron density ($10^{10}$ to $10^{12}$ $cm^3$) and a high fractional ionization rate ($10^{-4}$ to $10^{-1}$). In order to achieve a significant deposition rate while maintaining a reasonably high sputter-etching rate for gap-filling purposes, a significant amount of initial reactant (i.e., deposited species in the plasma) must flow through the reactor, but the system is typically kept at low pressure (less than 10 mTorr) constantly during deposition. As a result, the required vacuum system must have a high pumping capability throughput and robustness. It must withstand the high temperature and high reactivity of the reaction by-products while removing them at a high rate. For an HDP CVD system, an advanced turbomolecular pump is generally used to achieve a suitable deposition rate (at low pressure) and maintain acceptable pumping reliability.

FIG. 1 illustrates a prior art semiconductor device 10 having isolation trenches 11 formed in a substrate 12, the isolation trenches 11 having a relatively high aspect ratio. The aspect ratio refers to the ratio of the height (h) compared to the width (w) between the isolation trenches 11, and is expressed as a ratio of h:w, e.g., 3:1 or 4:1.

The semiconductor device 10 in this example comprises a DRAM device, where the trenches 11 comprise isolation trenches (IT's) that are adapted to electrically isolate element regions of a DRAM chip, for example. The element regions may comprise active areas, storage capacitors, transistors, and other electronic elements, as examples. The process of forming IT's is often also referred to in the art as shallow trench isolation (STI), for example.

Prior to formation of the isolation trenches 11 within the substrate 12, a pad nitride 14 may be deposited over the substrate 12. An insulating layer 16 is deposited over the semiconductor wafer 10 using HPD-CVD to fill the trenches between the active areas, as shown. Because of the high aspect ratio h:w, which may be 2:1 or greater, the HDP-CVD process may result in voids 20 that form within the trenches 11, as shown. This occurs because an insulator 16 deposited by HDP-CVD has a tendency to form cusps or huts 18 at the vicinity of the top portion of the trenches 11. This results in a greater thickness of the insulating layer 16 on the sidewall at the top of the trenches 11 compared to the sidewall deposition in the lower portion of the trenches 11. As a result, the top of the insulating layer 16 nearer the huts 18 closes, preventing the void regions 20 from being filled. The insulating layer 16 peaks 'pinch' the flow of insulating material 16 reactants into the trenches 11.

A problem in prior art isolation techniques is the formation of these voids 20 in high-aspect ratio trenches, especially as design rules for advanced integrated circuits require smaller dimensions. As previously noted, aspect ratios in DRAM devices are approaching 4:1 and greater. Moreover, as the minimum feature size is made smaller, the oxide gap fill of isolation trenches 11 becomes more challenging, especially in devices such as vertical DRAMs. Leaving voids 20 in a finished semiconductor device may result in device 10 failures. Voids 20 may inadvertently be filled with conductive material in subsequent processing steps such as gate conductor deposition, for example, which may short elements in the substrate.

Accordingly, there remains a need in the art for improved processes for gap filling high aspect ratio structures without forming voids or cusps during the deposition process.

SUMMARY OF INVENTION

Disclosed herein is a process for providing an oxide gap fill on a substrate, comprising providing a substrate with gaps to be filled; contacting the substrate with a first oxide precursor under high density plasma conditions at a first pressure less than about 10 millitorr, wherein said gaps are partially filled with a first oxide material; and further contacting the substrate with the second oxide precursor and an inert gas under high density plasma conditions at a second pressure greater than 10 millitorr, wherein said gaps are further filled with a second oxide material.

In another embodiment, a method of depositing a conformal dielectric layer on a substrate disposed in a process chamber, comprising providing a substrate on an electrode in the process chamber, wherein the substrate has at least one gap; flowing an oxide precursor into the process chamber at a pressure less than 10 millitorr to partially fill the gap; and increasing the pressure in the chamber to greater than 10 millitorr and flowing an inert gas into the chamber to fill the gap.

The above described and other features are exemplified by the following figures and detailed description.

BRIEF DESCRIPTION OF DRAWINGS

Referring now to the figures, which are exemplary embodiments and wherein the like elements are numbered alike.

FIG. 5 illustrates a scanning electron photomicrograph of a prior art gap filling process; and.

FIG. 6 illustrates a scanning electron photomicrograph of a gap filling process in accordance with the present disclosure.

DETAILED DESCRIPTION

Disclosed herein is a process for filling gaps, e.g., trenches, with an insulating material. The process generally comprises contacting the substrate with an insulating material precursor without argon under high density plasma conditions at a first pressure of less than about 10 millitorr, wherein said gaps are partially filled with the insulating material; and further contacting the substrate with the insulating material precursor with argon under high density plasma conditions at a second pressure greater than about 10 millitorr, wherein said gaps are further filled with oxide. The process may be repeated if necessary to completely fill the trench.

The insulating layers are preferably deposited using a high-density plasma chemical vapor deposition (HDP-CVD) system. Typically, gaps having a high aspect ratio greater than 2:1 may be present on the substrate upon which the dielectric is to be deposited, with the substrate being positioned in a process chamber of the HDP-CVD system. Deposition gases., such as a silicon source gas and an oxygen source gas are flowed across the surface of the substrate with or without an inert gas such as argon, hydrogen, helium, krypton, xenon and the like. An RF source generator and an RF bias generator are each in electrical communication with the process chamber to form plasma from the process gases.

Figure 1:
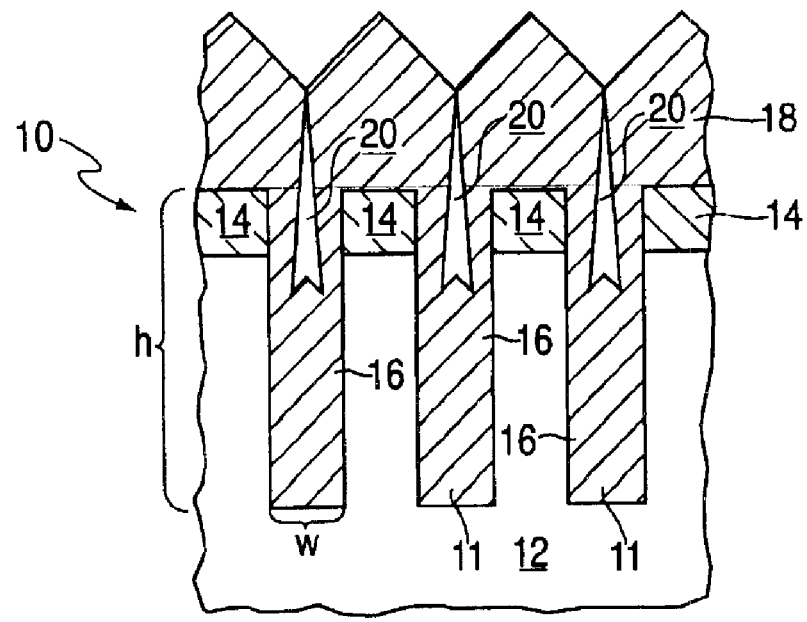
FIG. 1 illustrates a cross-sectional view of a prior art DRAM having voids in the HDP-CVD insulating material between isolation regions or trenches.
Figure 2:
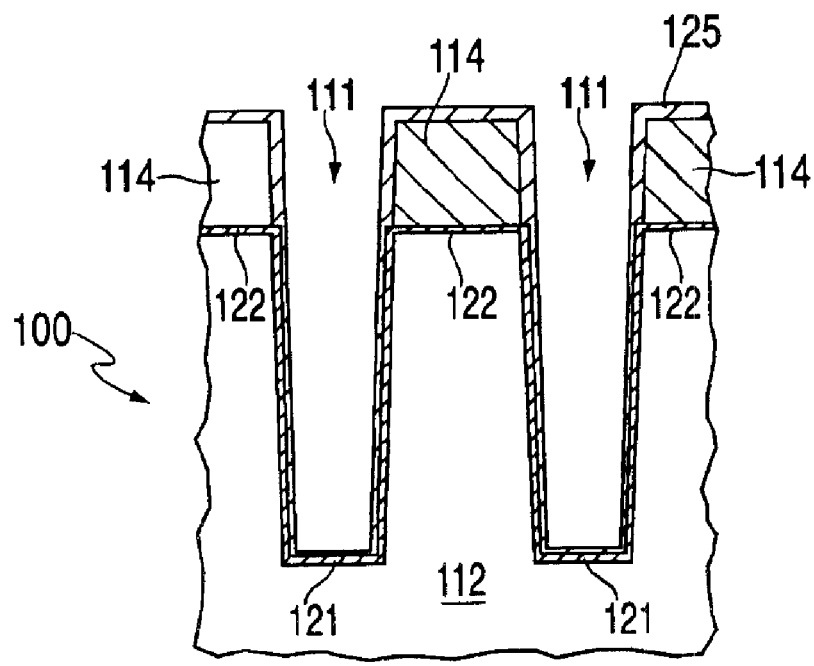
FIGS. 2–4 illustrate cross sectional views of a process for providing an oxide gap fill on a substrate in various stages of manufacturing.
Figure 3:
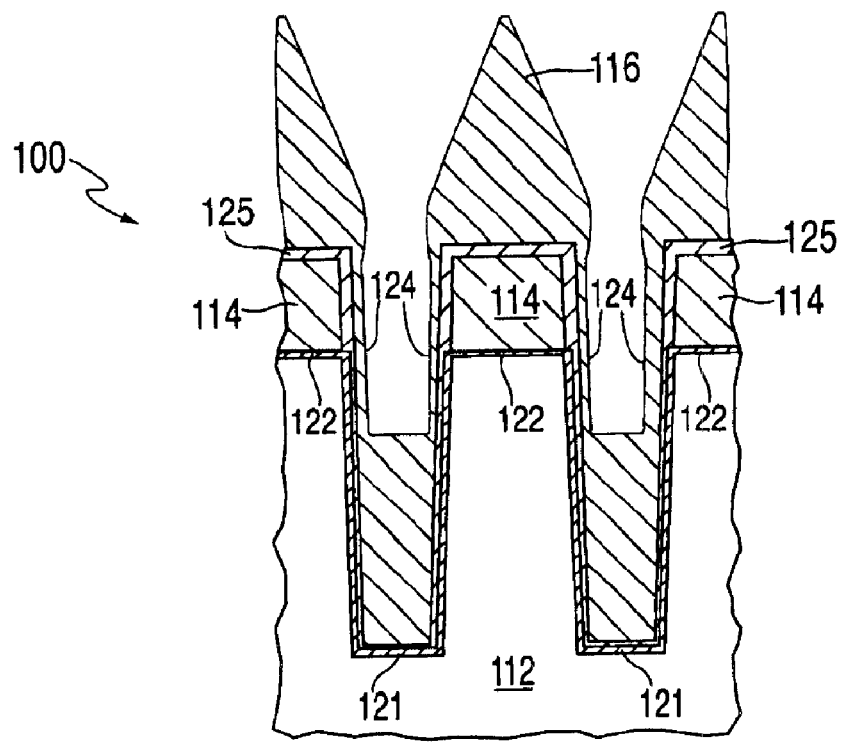
Figure 4:
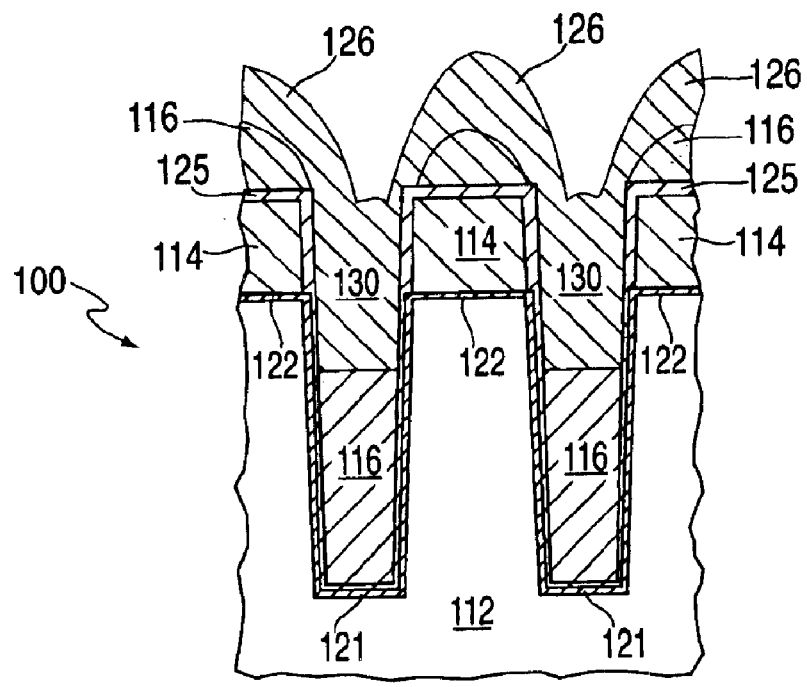

FIGS. 2 to 4 illustrate cross sectional views of a semiconductor device in various stages of manufacturing employing the gap filling process, which process will now be described in greater detail. Referring to FIG. 2, a semiconductor wafer 100 having a substrate 112 is first provided. The semiconductor device formed in the wafer 100 may comprise a DRAM or other memory device, or may alternatively comprise other types of semiconductor devices. The substrate 112 may comprise silicon or other semiconductor materials. The substrate 112 may include element regions comprising active areas (AA's), storage capacitors, and other electronic elements that need to be isolated from one another in the end product. To provide this isolation, isolation trenches 111 are formed within the substrate 112.

Prior to formation of isolation trenches 111, a pad oxide 122 may be formed over the substrate 112. Pad oxide 122 typically comprises about 30 to about 100 angstroms of silicon oxide, for example. A pad nitride 114 may then be deposited over the pad oxide 122. Pad nitride 114 may comprise silicon nitride or other nitrides and may be about 1,000 Angstroms thick.

Isolation trenches 111 are then formed using lithographic and etching processes. Trenches 111 may be about 400to about 800 nanometers deep within the silicon 112, and as such, have aspect ratios of 2:1, 3:1, 4:1, or greater, depending on the design rules. A sidewall oxide 121 is formed within isolation trenches 111 over the substrate 112. The sidewall oxide 121, also referred to as an active area oxide (AA ox), preferably comprises thermally grown silicon oxide and may be approximately between about 50 and about 150 Angstroms thick.

Preferably, an optional nitride liner 125 is deposited within isolation trenches 111 over the pad oxide 121. Nitride liner 125 preferably comprises silicon nitride and may alternatively comprise other nitrides. The nitride liner 125 preferably is about 30 to about 100 Angstroms thick.

A first insulating material 116 is deposited over the wafer 100 within the isolation trenches 111, as shown in FIG. 3. In this figure, the deposited oxide has a relatively large hut height with small cusps consistent with a high D/S ratio. The drawback of using such a process for the entire fill process is more the creation of small seams caused by very tall huts growing into each other rather than traditional void formation caused by excessive anisotropic sputtering. First insulating material 116 preferably comprises a dielectric material such as $SiO_2$, silicon nitride, silicon oxynitride, silicon carbide, compounds thereof, phosphorous silicon-doped glass (PSG), boron PSG (BPSG), TEOS based silicate glass, fluorinated silicate glasses, and the like. The exact composition will depend upon the precursors employed for the insulating material.

For illustrative purposes only, reference will be made hereinafter to the use of $SiO_2$ insulating materials and precursors. It should be understood that the use of $SiO_2$ insulating materials is exemplary only, and other suitable insulating materials and precursors may be used, wherein it is generally desirable to fill a gap with the insulating material while avoiding void formation, especially for higher aspect ratio structures with relatively small critical dimensions. The silicon source gas preferably includes silane gas, $SiH_4$, and the oxygen source gas includes molecular oxygen gas, $O_2$. Other precursor gases suitable for practicing the process will be apparent to those skilled in the art in view of this disclosure.

Preferably, first insulating material 116 is deposited in an anisotropic deposition process, such as HDP-CVD (preferably at high deposition to sputter ratio, low reactor pressure, and low reactant gas flow), so that only a small amount of insulating material 116 is deposited on the sides of the isolation trenches 111, shown generally at 124. In particular, the first insulating material 116 is deposited over the substrate 112 topography such that the first insulating material 116 thickness within the bottom of the trenches 111 exceeds the first insulating material 116 thickness on the sidewalls of the trenches 111. The first insulating material 116 is preferably partially deposited within trenches 111 in a thickness of about 0 nm to about 300 nanometers in the trench 111 bottom for a trench of about 600 to about 800 in depth. The HDP-CVD conditions for anisotropically depositing the first insulating layer generally provides a deposition/sputtering-rate (D/S) ratio of about 8 to about 12. The deposition/sputtering-rate ratio (D/S) is an important measure of the gap-filling capability of the processes. As used herein, the D/S ratio is mathematically defined as shown in Equation (I).

D/S=(net deposition rate+blanket sputtering rate)/blanket sputtering rate (I).

The process chamber pressure for depositing the first insulating layer may be about 2 to about 10 millitorr, with about 4 to about 5 millitorr being the preferred pressure range for most oxide gas precursors. The power setting is dependent on tool sets. In 300 mm HDP oxide tool sets, the bias power (about 3 to about 7 KW) is usually higher than the dissociation power (about 2 to about 4 KW).

To deposit the first insulating layer, the silane and oxygen gases are flowed into the process chamber. No argon gas is employed during deposition of the first insulating layer. Specifically, silane is preferably flowed into the process chamber at a flow rate in the range of about 20 to about 120 standard cubic centimeters per minute (sccm), with a flow rate of about 30 to 80 sccm more preferred, and with a flow rate of about 30 to about 50 sccm even more preferred. Oxygen is preferably flowed into the process chamber at a flow rate in the range of about 30 to about 250 sccm, with about a flow rate of about 30 to about 100 sccm more preferred, and with a flow rate of about 40 to about 70 sccm even more preferred. Generally, the process time employed for depositing the first insulating layer is about 30 seconds to about 10 minutes or longer depending on the dimensions of the gap to be filled. Under these conditions, the first insulating material 116 is preferably partially deposited within trenches 111 in a thickness of about 200 to about 400 nanometers in the trench 111 bottom.

A second insulating material 126 is then deposited over the wafer 100, as shown in FIG. 4. The second insulating material 126 is preferably deposited using a deposition process with an isotropic sputter etch component in order to deposit more insulating material 126 over the bottom of the isolation trenches 111 (over the first insulating layer 116) than is deposited on the sides of the isolation trenches 111. The HDP-CVD conditions for depositing the second insulating layer 126 generally provides a D/S ratio of less than about 10. The process chamber pressure is preferably greater than 10 millitorr, with a pressure greater than about 50 millitorr more preferred, with a pressure of about 100 millitorr to about 500 millitorr even more preferred for most oxide gas precursors. Pressures greater than about 500 to about 1,000 millitorr or greater are also contemplated herein. Increasing the chamber pressure can be by any suitable means including, but not limited to, the use of a throttle valve disposed the vacuum line between the process chamber and the vacuum turbopump. While not wanting to be bound by theory, it is believed that by operating the plasma at a high pressures (greater than about 10 mTorr), more redeposition through sputtering reactions occur at the sidewalls of the trench structure, which redeposition tends to be more conformal. As such, the species generated in the plasma during high-pressure conditions leads to more isotropic sputtering. As a result, the probability of redeposition is less dependent on the geometrical configuration of the trench structure.

In a preferred embodiment, argon is flowed along with the silicon source and the molecular oxygen source. Specifically, silane is preferably flowed into the process chamber at a flow rate in the range of about 20 to about 120 standard cubic centimeters per minute (sccm), with a flow rate of about 30 to 80 sccm more preferred, and with a flow rate of about 30 to about 50 sccm even more preferred. Oxygen is preferably flowed into the process chamber at a flow rate in the range of about 30 to about 250 sccm, with about a flow rate of about 30 to about 100 sccm more preferred, and with a flow rate of about 40 to about 70 sccm even more preferred. Argon is preferably flowed into the process chamber at a flow rate in the range of about 0 to about 100 sccm, with about a flow rate of about 10 to about 60 sccm more preferred, and with a flow rate of about 20 to about 40 sccm even more preferred. Under these conditions, the second insulating material 126 is deposited within trench structure 111.

If the aspect ratio of the trenches 111 is small enough, the second insulating material 126 thickness may be sufficient to completely fill the isolation trenches 111 to the top of the pad nitride 114 layer or greater. A third step may be employed even after the trench is completely filled to improve uniformity over the surface topography so as to better meet chemical-mechanical polish (CMP) requirements. CMP may be performed (not shown) to remove the undesired insulating material 116 and 126 from the top of the pad nitride 114, and subsequent processing steps may be performed on the wafer 100 to complete the manufacturing process.

Optionally, a third insulating material can be deposited over the wafer 100 within trenches 111 using a deposition process such as HDP-CVD to completely fill the isolation trenches 111, if necessary. The third insulating material is preferably deposited without argon at pressures less than 10 mTorr as previously described. A CMP is performed (not shown) to remove the undesired insulating material layers from the top of the pad nitride 114, and subsequent processing steps are performed on the wafer 100 to complete the manufacturing process.

Because the sequence of insulating material layer (e.g., 116/126) HDP-CVD deposition in the trench 111 and the etch processes to remove the insulating material from the isolation trench 111 sidewalls results in complete gap fill, there is no possibility of conductive or contaminating materials such as from gate poly-Si or CMP slurry becoming lodged within the isolation trenches 111, creating shorts or defects.

FIGS. 5 and 6 pictorially illustrate scanning electron micrographs of a prior art process where pressure is maintained below 10 millitorr and the current process where the second insulating layer is deposited at high pressure, i.e., greater than 10 mTorr. The lower pressure process, as shown in FIG. 5, tends to result in low hut height and also has been found to result in void formation with trench dimensions less than 170 nanometers with aspect ratios greater than 2:1. In contrast, the process as described herein provides robust gap fill without void formation and can be used for aspect ratio trench features with critical dimensions less than 170 nanometers. Again, while not wanting to be bound by theory, it is believed that the high degree of isotropic etch sputtering during high pressure plasma deposition removes sidewall deposition more isotropically than low pressure plasma deposition with less collisions in the gas phase.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A process for providing an oxide gap fill on a substrate, comprising:

providing a substrate with gaps to be filled;

contacting the substrate with a first oxide precursor under high density plasma conditions at a first pressure less than about 10 millitorr, wherein said gaps are partially filled with a first oxide material; and further contacting the substrate with the second oxide precursor and an inert gas under high density plasma conditions at a second pressure greater than 10 millitorr, wherein said gaps are further filled with a second oxide material.

2. The process of claim 1, wherein the second pressure is greater than about 50 millitors.

3. The process of claim 1, wherein the second pressure is at about 100 millitorrs to 500 millitorrs.

4. The process of claim 1, wherein the second pressure is greater than about 500 millitorrs.

5. The process of claim 1, wherein the steps are repeated to completely fill the gap.

6. The process of claim 1, wherein the inert gas comprises argon, helium, hydrogen, or combinations comprising at least one of the foregoing gases.

7. The process of claim 1, wherein the gas flow and power are constant during high-density plasma conditions of the first and second pressures.

8. The process of claim 1, wherein the first and second oxide materials are different.

9. The process of claim 1, wherein the first and second oxide materials comprise silicon dioxide, silicon oxynitride, phosphorous silicon-doped glass, boron phosphorous silicon-doped glass, tetraethyoxysilane based silicate glass, and fluorinated silicate glass.

10. The process of claim 1, further comprising providing an oxide liner over the substrate after said gaps are further filled with the second oxide material.

11. The process of claim 10, further comprising depositing a nitride layer over the oxide liner.

12. The process of claim 1, further comprising contacting the substrate with a third insulating layer precursor under high density plasma conditions at a third pressure less than 10 millitorr, wherein said gaps are further filled with a third insulating layer material.

13. A method of depositing a conformal dielectric layer on a substrate disposed in a process chamber, comprising:

providing a substrate on an electrode in the process chamber, wherein the substrate has at least one gap;

flowing an oxide precursor into the process chamber under high density plasma conditions at a pressure less than 10 millitorr to partially fill the at least one gap; and increasing the pressure in the chamber to greater than 10 millitorr and flowing an inert gas into the chamber to fill the at least one gap.

14. The process of claim 13, wherein the inert gas comprises argon, helium, hydrogen, or combinations comprising at least one of the foregoing gases.

15. The process of claim 13, wherein the pressure in the chamber is increased to greater than 50 millitorr.

16. The process of claim 13, wherein the pressure in the chamber is increased to greater than 100 millitorr.

17. The process of claim 13, wherein the pressure in the chamber is increased to greater than 1,000 millitorr.

18. The process of claim 13, wherein flowing the oxide precursor comprises silane and oxygon gas.

19. The process of claim 13, wherein flowing the oxide precursor comprises flowing silane at a flow rate of about 20 to about 120 sccm, flowing oxygen at a flow rate of about 30 to about 250 sccm, and flowing argon at a flow rate of about 0 to about 100 sccm.

20. The method of claim 13, wherein the at least one gap as an aspect ratio greater than 2:1.

21. The method of claim 13, wherein flowing the oxide precursor into the process chamber is at a constant flow rate and a constant power.

22. A process for providing a gap fill on a substrate, comprising:

providing a substrate with gaps to be filled;

contacting the substrate with a first insulating layer precursor under high density plasma conditions at a first pressure less than about 10 millitorr, wherein said gaps are partially filled with a first insulating layer material; and further contacting the substrate with a second insulating layer precursor and an inert gas under high density plasma conditions at a second pressure greater than 10 millitorr, wherein said gaps are further filled with a second insulating layer material.

23. The process of claim 22, wherein the first and second insulating layer materials comprise one or more of silicon dioxide, silicon nitride, silicon oxynitride, silicon carbide, phosphorous silicon-doped glass, boron phosphorus silicon-doped glass, tetraethoxysilane based silicate glass, and fluorinated silicate glass.

* * * * *